(12) United States Patent
Dietze et al.

(10) Patent No.: US 6,562,128 B1
(45) Date of Patent: May 13, 2003

(54) IN-SITU POST EPITAXIAL TREATMENT PROCESS

(75) Inventors: Gerald R. Dietze, Portland, OR (US); Oleg V. Kononchuk, Brush Prarie, WA (US)

(73) Assignee: SEH America, Inc.

( * ) Notice: Subject to any disclaimer, the term of this patent is extended or adjusted under 35 U.S.C. 154(b) by 0 days.

(21) Appl. No.: 10/150,398

(22) Filed: May 17, 2002

Related U.S. Application Data

(63) Continuation-in-part of application No. 09/997,139, filed on Nov. 28, 2001, now Pat. No. 6,471,771.

(51) Int. Cl.$^7$ .............................................. C30B 25/02
(52) U.S. Cl. .................... 117/97; 117/102; 118/715; 118/719; 118/723 E
(58) Field of Search .................. 117/84, 97, 102; 118/715, 719, 723 E

(56) References Cited

U.S. PATENT DOCUMENTS

| | | |
|---|---|---|
| 5,730,801 A | 3/1998 | Tepman et al. |
| 5,735,949 A | 4/1998 | Mantl et al. |
| 5,780,342 A | 7/1998 | Wang |
| 5,851,892 A | 12/1998 | Lojek et al. |
| 5,907,792 A | 5/1999 | Droopad et al. |
| 5,972,804 A | 10/1999 | Tobin et al. |
| 6,040,207 A | 3/2000 | Gardner et al. |
| 6,306,735 B1 | 10/2001 | Schauer |
| 6,338,756 B2 | 1/2002 | Dietze |

*Primary Examiner*—Felisa Hiteshew
(74) *Attorney, Agent, or Firm*—Douglas G. Anderson

(57) ABSTRACT

A process for forming an epitaxial layer on a semiconductor wafer substrate is provided. The process comprises providing a semiconductor wafer substrate and an area for forming an epitaxial layer on said semiconductor wafer substrate. The formation area consists essentially of an epitaxial layer process chamber. The semiconductor wafer substrate is introduced into the epitaxial layer process chamber and an epitaxial layer is formed on at least one surface of the semiconductor wafer substrate. Then, a chemical reagent is introduced into the epitaxial layer process chamber. The chemical reagent reacts with the epitaxial layer surface in situ to form an outer protective oxide layer.

11 Claims, 4 Drawing Sheets

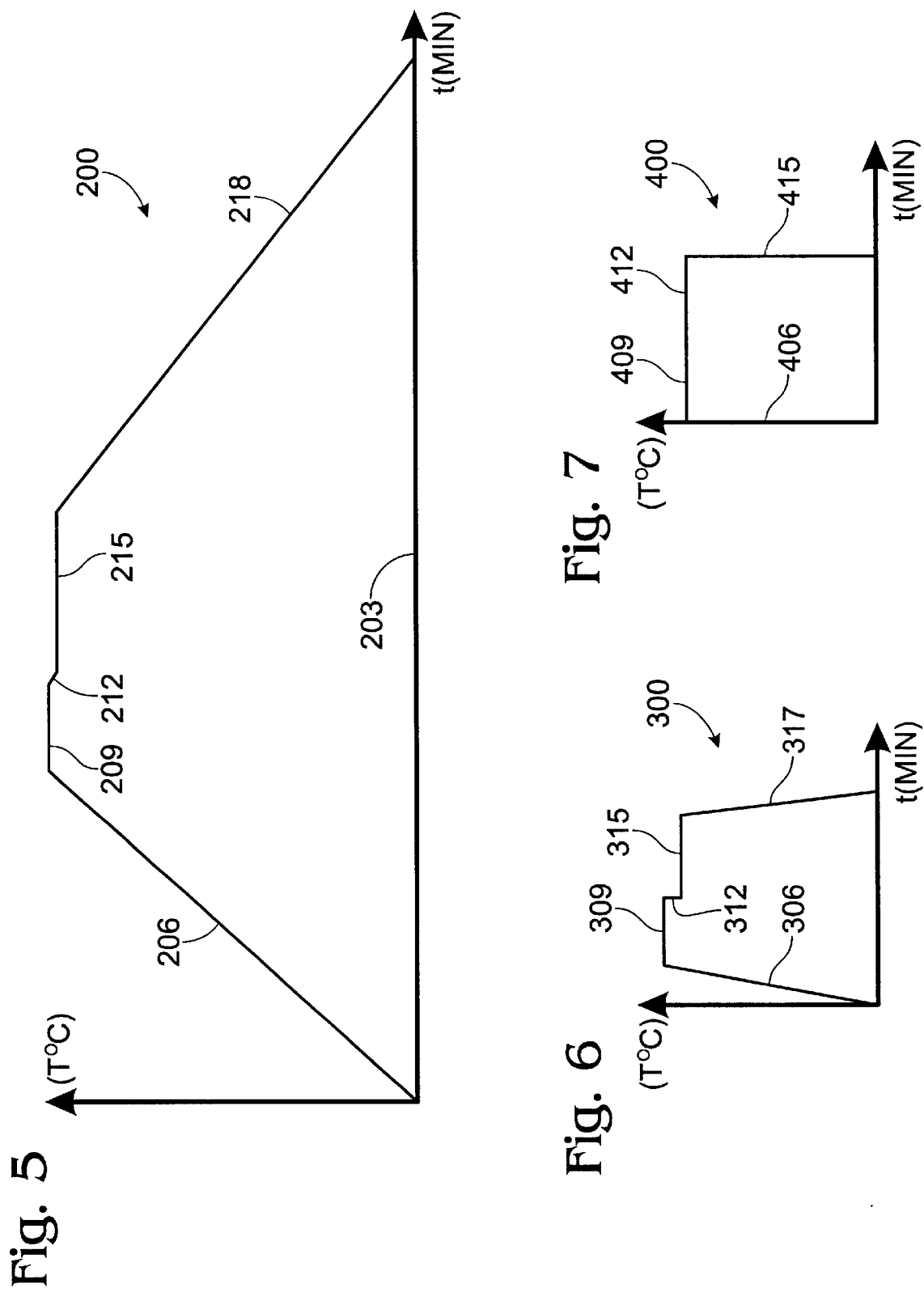

IN-SITU POST EPITAXIAL TREATMENT PROCESS

REFERENCE TO RELATED APPLICATIONS

This application is a continuation-in-part of U.S. application Ser. No. 09/997,139, filed Nov. 28, 2001, now U.S. Pat. No. 6,471,771 which is hereby incorporated herein in its entirety by reference.

BACKGROUND OF THE INVENTION

This invention relates to a process for forming a protective oxide film in-situ after deposition of an epitaxial silicon layer on a silicon substrate wafer.

Epitaxial deposition is a film grown over a crystalline substrate in such a way that the atomic arrangement of the film bears a defined crystallographic relationship to the atomic arrangement of the substrate wafer. In the case of a monocrystalline substrate wafer, the crystallographic orientation of the epitaxial layer will replicate that of the substrate wafer wherein the substrate wafer provides the crystallographic seed for epitaxial growth.

Commonly, growth of an epitaxial layer is accomplished by chemical vapor deposition (CVD) at temperatures well below the melting point of either the substrate wafer or the film being deposited. In the CVD technique, the substrate wafer is heated in a chamber into which reactive and carrier gases are introduced. For silicon deposition, reactive gases include Silane ($SiH_4$), Dichlorosilane ($SiH_2Cl_2$), Trichlorosilane ($SiHCl_3$), and Silicon Tetrachloride ($SiCl_4$), with dopant gases that include Arsine ($AsH_3$), Phosphine ($PH_3$), and Diborane ($B_2H_6$), and a carrier gas of hydrogen.

Epitaxial reactors are generally available in three basic designs. The first design involves placing the substrate wafers on holders, called susceptors, in a horizontal position. Reactive and carrier gases are then introduced into the growth chamber at one side, passed over the substrate wafers, and exhausted out the other side. The second design employs a vertical system wherein the substrate wafers are placed horizontally on a rotating susceptor, and the gases are introduced into the chamber at the top, passed over the wafers, and exhausted out of the chamber at the bottom. Finally, the third design places the wafers near vertically on a barrel-type rotatable susceptor, with the gases introduced in the top of the chamber, passed over the wafers, and exhausted out the bottom of the chamber. Older technology produced multiple wafers simultaneously, and utilized each of these three designs. Newer technology, however, typically processes wafers individually, and employs the first general design wherein the wafer is placed horizontally on a rotating susceptor, and the gases are introduced at one side of the chamber, passed over the wafer, and exhausted out the other side.

In each design, the susceptor is made of a nonreactive material capable of enduring extreme temperature and pressure variations, such as graphite, and typically silicon carbide coated graphite. Heat is typically supplied by radio frequency (RF), ultraviolet (UV), infrared radiation (IR), or electrical resistance heaters, with processing temperatures ranging from about 900° C. to 1200° C.

In general, epitaxial deposition begins by loading the substrate wafer(s) onto the susceptor, and purging the ambient air out of the reaction chamber by supplying non-reactive gases such as helium, argon, or nitrogen, into the chamber. The temperature is then ramped up to the desired level, and a mixture of the carrier gas and the reactive gases (including any desired dopant gas) is introduced into the chamber. When the desired epitaxial layer thickness is achieved, non-reactive gases are reintroduced into the chamber, and the temperature is ramped down. The wafer is then unloaded from the chamber.

If desired, an etching agent such as anhydrous hydrogen chloride (HCl) can be introduced before carrier and reactive gases are introduced. This etching agent will remove a thin layer off the surface of the substrate wafer, as well as any contaminants adhered thereto. After such an etch, a contaminant free substrate surface with strong crystallographic structure is provided for epitaxial deposition, and generally results in a higher quality epitaxial layer. This etching step can also be employed without the substrate wafer present, as a means of controlling epitaxial deposition on the susceptor or other surfaces in the growth chamber. Additionally, prior to epitaxial deposition, a hydrogen bake can be used to remove any native oxide growth on the surface of the wafer, by chemical reduction. This will provide a clean silicon surface on the substrate for epitaxial deposition.

In the case of a silicon epitaxial layer deposited on a silicon substrate wafer, the surface of the epitaxial layer is hydrophobic. Such a hydrophobic layer is very reactive, and prone to attract contaminants. As such, it is common in the industry to employ a wafer cleaning and oxidizing step after the epitaxial deposition is complete. This cleaning and oxidizing is done to remove any contaminants that might have adhered to the epitaxial surface upon being removed from the deposition chamber, and to put a protective oxide layer, such as silicon dioxide ($SiO_2$) on the surface of the epitaxial layer. An oxide layer surface is hydrophilic, which is much less reactive than a hydrophobic surface, and therefore does not as readily attract contaminants. The oxide layer is therefore used to protect the surface of the wafer from contaminants until the wafer is ready for further processing, wherein the oxide layer is removed and the silicon epitaxial layer is exposed and ready for processing.

This cleaning and oxidizing step adds both processing time and cost to the production of the wafer and requires additional equipment and chemical usage. It is well known in the industry to use a wet chemical bench to clean and oxidize the wafer surface. A typical cleaning and oxidizing process involving subjecting the wafer to submersion in two sequential solutions is as follows:

$NH_4OH$ (29 weight %)+$H_2O_2$ (30%)+DI $H_2O$ at 70–80° C.; and

HCl (37 weight %)+$H_2O_2$ (30%)+DI $H_2O$ at 75–80° C. Subjecting wafers so these solutions will slightly etch the surface of the wafer to remove contaminants, and then generate a thin oxide layer. This method of oxidizing is relatively uncontrolled however, and the thickness of the oxide layer is hard to control and predict.

SUMMARY OF THE INVENTION

The present invention relates to a process that overcomes the disadvantages and problems set forth above. More specifically, a process is provided for growing an outer protective layer on the outer surface of a semiconductor wafer directly in an epitaxial reactor chamber immediately after epitaxial deposition. The subject process involves the growing of protective films in reactors designed explicitly for the deposition of epitaxial silicon films. The growth of these protective films is accomplished during typically an unproductive part of the deposition cycle, namely, the cool-down phase. In any case, the oxidation occurs before the wafer is removed from the epitaxial deposition equipment.

By incorporating the novel process technique of the present invention into the epitaxial reaction sequence, the elimination of the costly and time-consuming cleaning and oxidizing step will result. Further, since the oxidation occurs in the epitaxial equipment, the process can be much more tightly controlled, and will result in a higher quality oxide.

Additionally, by incorporating the process of the present invention, the application of an outer layer on the epitaxial silicon is not limited to an oxide, but could also include nitrides, or other beneficial layers. Nitride layers cannot currently be achieved through any presently available wet treatment technique.

These features are believed to be a novel approach utilizing existing epitaxial deposition equipment, and applying a new method. The invention discloses a method that will allow for the elimination of post-epitaxial wet processing for cleaning and oxidizing in preparation for wafer storage. More specifically, the method comprises introducing a monocrystalline substrate wafer into epitaxial equipment, processing the wafer to form an epitaxial layer on the surface of the substrate wafer and having the same crystalline properties as the substrate wafer, and then forming a protective layer on the surface of the epitaxial layer before removing the wafer from the epitaxial equipment.

The semiconductor wafer substrate is introduced into the epitaxial layer process chamber, and the temperature in the epitaxial layer process chamber is increased to a predetermined operating temperature. Typical operating temperature during epitaxial deposition ranges from about 1025° C. up to about 1150° C., and preferably from about 1050° C. to 1100° C. Typical operating pressure is about 760 Torr for atmospheric deposition, but can go down to about 1 Torr for low pressure applicatons. Upon achieving the desired temperature, appropriate reactive and carrier gases are introduced into the epitaxial deposition chamber to facilitate layer growth. The operating temperature is maintained for a time sufficient to facilitate epitaxial layer growth of a layer up to 15 microns thick, preferably in the range of 2 to 4 microns thick. Upon achieving the desired layer thickness, the reactive gas supply is terminated, and the deposition chamber is purged with non-reactive gas. As previously described, the epitaxial layer is hydrophobic in nature, is of uniform thickness, and has the same crystallographic orientation as that of the substrate wafer.

The temperature of the deposition chamber is then ramped down to a desired unload temperature. While ramping down the temperature, a chemical reagent gas is introduced into the epitaxial deposition chamber. Preferably, the step of introducing the reagent gas into the deposition chamber occurs immediately after purge gas is introduced into the chamber. In another preferred embodiment, the operating temperature is ramped down to a predetermined reduced temperature before introduction of the reagent gas.

When the reagent gas is introduced into the deposition chamber, the reagent gas reacts in-situ with the hydrophobic epitaxial layer surface to form an outer layer that is substantially hydrophilic. In one preferred step the substantially hydrophilic outer layer surface is an in-situ oxidation step. In another preferred step the substantially hydrophilic outer layer surface is an in-situ nitridation step. The reaction between the reagent gas and the hydrophobic epitaxial layer is preferably conducted without any additional heat being added to the deposition chamber, but rather takes advantage of the heat present from the epitaxial deposition during the temperature reduction step. Yet another additional process step preferably includes the step of subsequently depositing in-situ at least one additional layer onto the substantially hydrophilic outer layer.

In any case, it is preferred that the step of reacting the reagent gas with the hydrophobic epitaxial layer to form the hydrophilic layer is conducted without requiring substantial additional process time compared to the epitaxial deposition process described above.

In an alternate embodiment, a stabilized heat controlled process could be added to the epitaxial deposition process specifically added to support the formation of the protective hydrophilic layer. In this case, the process time required for processing in the epitaxial equipment is slightly increased, such as for an additional 20 seconds of controlled heating. By controlling the temperature during formation of the hydrophilic layer, more precise control of the layer thickness and uniformity can be achieved. Again, the formation of the hydrophilic layer is accomplished in-situ after deposition of the epitaxial layer, and before the wafer is removed from the epitaxial equipment.

The foregoing and other objects, features and advantages of the invention will become more readily apparent from the following detailed description of a preferred embodiment that proceeds with reference to the drawings.

BRIEF DESCRIPTION OF THE DRAWINGS

FIG. 5 is a schematic depiction of the process of epitaxial deposition related to equipment used in FIG. 1.

FIG. 6 is a schematic depiction of the process of epitaxial deposition related to equipment used in FIG. 2.

FIG. 7 is a schematic depiction of the process of epitaxial deposition related to equipment used in FIG. 3.

DETAILED DESCRIPTION OF THE INVENTION

Figure 1:
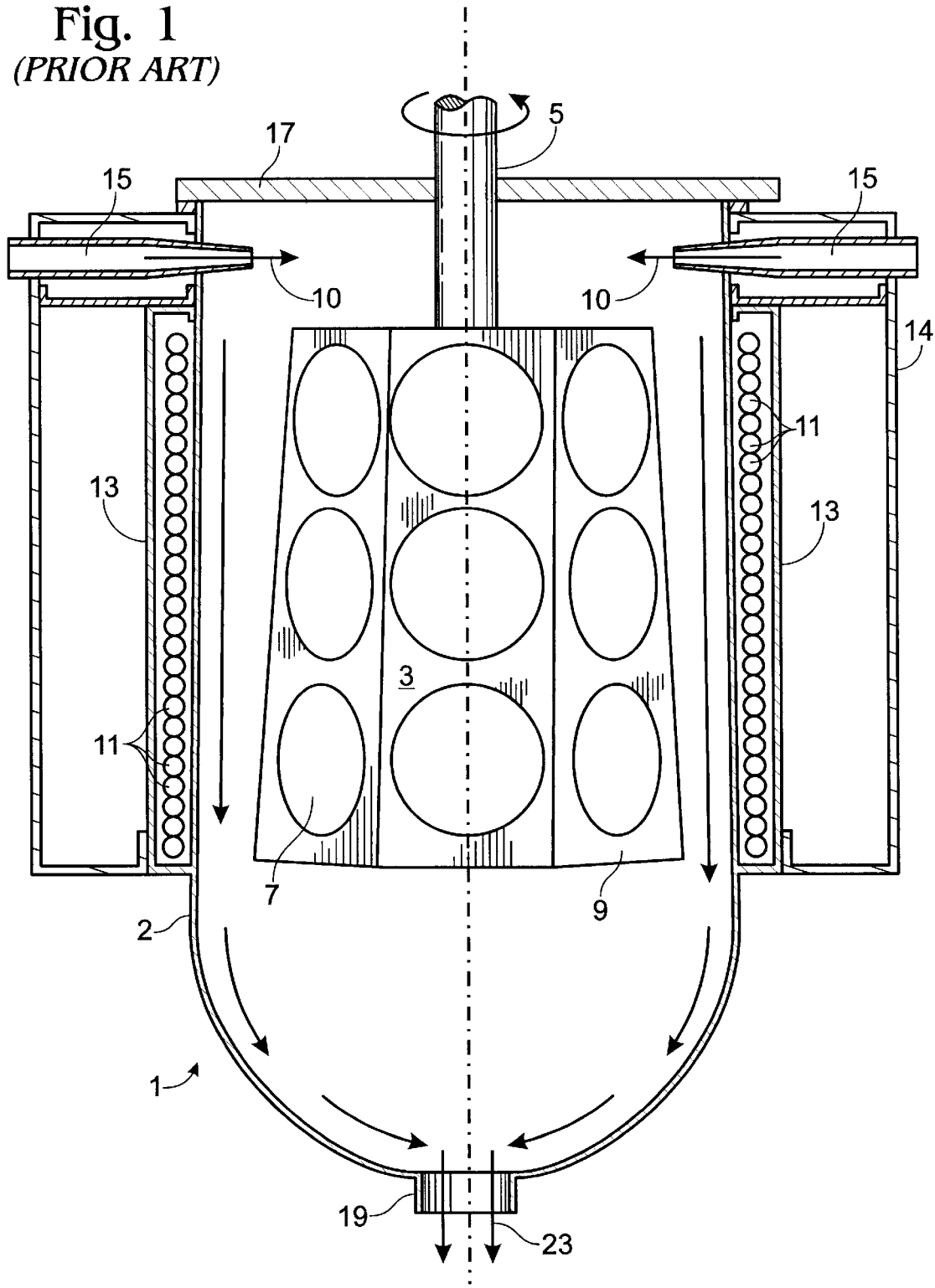
FIG. 1 is a schematic sectional view of a conventional cylindrical or barrel type-batch epitaxial reactor.

FIG. 1 shows a typical cylindrical or barrel type batch epitaxial reactor (1), in which a polyhedral susceptor (3) is inserted within a bell jar (2). The susceptor can be rotated via a rotational shaft (5). The susceptor (3) contains individual facets (9) that include recessed pockets (7) which can accommodate semiconductor wafers (not shown) within each pocket (7). There can be one pocket (7) or a multitude thereof, depending on the wafer diameter to be processed. The bell jar (2) is surrounded by a quartz lamp heater (11) and a reflective heat shield (13) which is designed to heat the susceptor (3) and the wafers (not shown) through the wail of the bell jar (2) by reflecting incident energy back toward the susceptor (3). The entity is hermetically sealed with a top plate (17) and process gases (10) are introduced into the reaction chamber via the gas inlets (15).

Once the process gases (10) have reacted with the wafers, any remaining process gases (10) and any byproducts (23)

which may be produced, are flushed out through the exhaust opening (19). The space defined by the heat shield (13) and the outer wall (14) usually houses a cooling mechanism, such as a cooling gas and/or water pipes (not shown).

Figure 2:
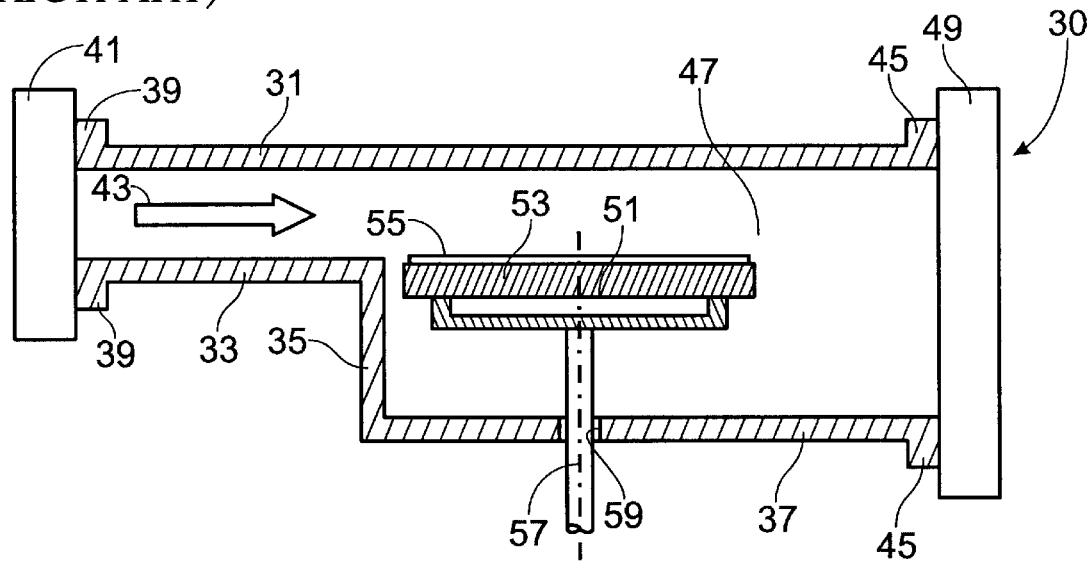
FIG. 2 is a schematic sectional view of a conventional single wafer epitaxial process chamber wherein deposition of an epitaxial layer occurs in deposition equipment know as an "ASM Reactor".

A typical single wafer epitaxial reactor chamber (30) is shown in FIG. 2. In this type of epitaxial reactor, a generally plate-shaped susceptor (53) is mounted on a chuck (51), which is in turn supported and rotated by a rotary shaft (57). The rotary shaft (57) extends through a coupling (59), which allows for rotation and vertical adjustment. The susceptor (53) is enclosed by a top panel (31), a bottom panel (33), a vertical wall section (35), and a lower chamber bottom panel (37). Two side panels (not shown) complete the enclosure of the unit such that the susceptor (53) is completely enclosed. Top panel (31), bottom panel (33), and the two side panels (not shown) mate with a gas injector (41) at injector flange (39), and mate with a gas outlet (49) at outlet flange (45).

Figure 3:
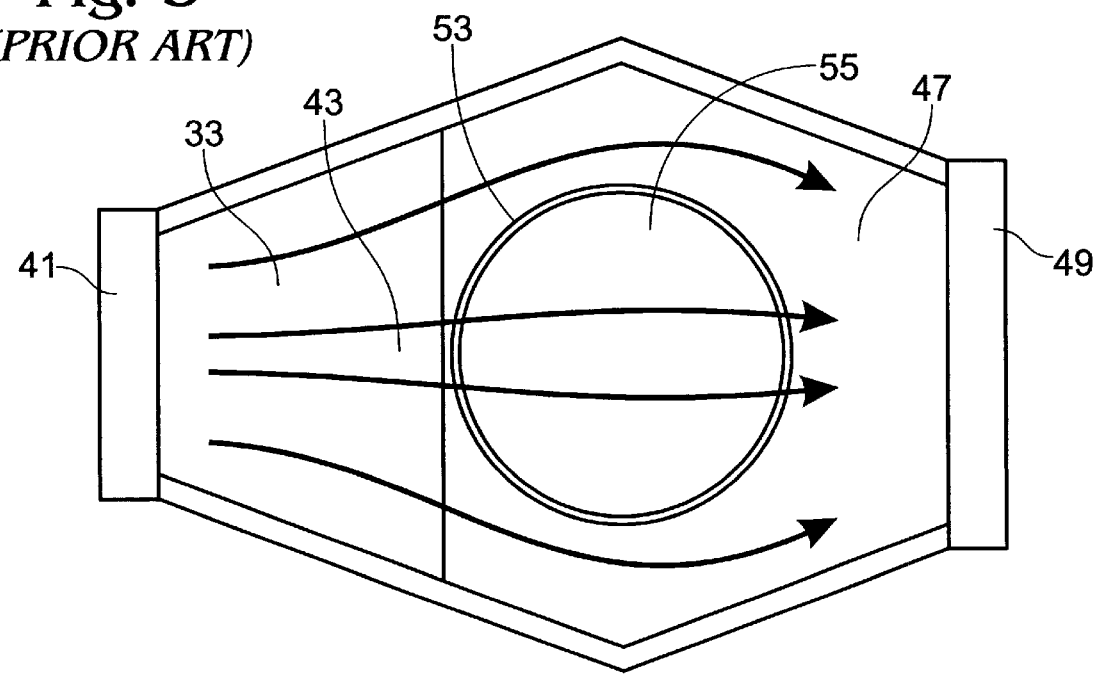
FIG. 3 is a top view of the conventional single wafer epitaxial process chamber of FIG. 2.

A wafer (55) is removably positioned onto the susceptor (53), and vertically adjusted to be in the optimal position for gases to flow over the wafer (55). The wafer (55) is heated by quartz lamps (not shown) or a quartz lamp arrangement that is placed on the top, on the bottom, or on both sides of the reaction chamber. As shown in FIG. 3, the process gases are introduced with established gas flow and velocity, as indicated by the arrow (43). The process gases will flow across the wafer (55), proceed to the rear portion (47) of the reaction chamber, and exit through the gas outlet (49). The process gases are similar to those described for the cylindrical type batch reactor.

Figure 8:
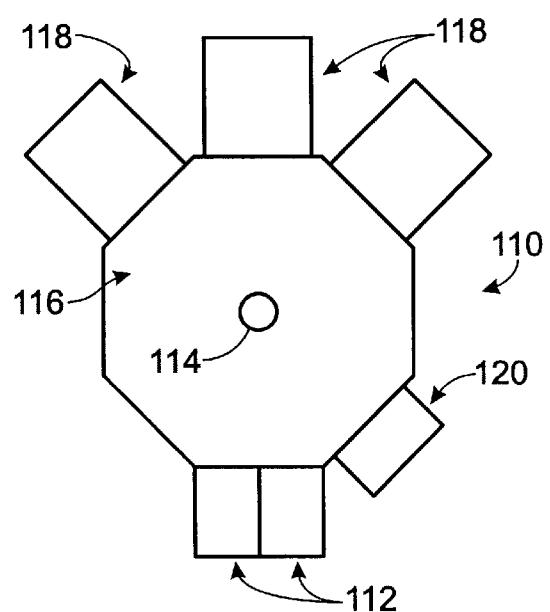
FIG. 8 is a schematic depiction of a "Centura Reactor".

Another type of single wafer epitaxial reactor is shown in FIG. 8. This type is marketed by Applied Materials Corporation and is commonly known as the "Centura Reactor". The reactor (110) contains one or more loading chambers (112) where wafer carriers (not shown) are placed. An automated wafer handler (114), located within a transfer chamber (116), is used to transport individual wafers from a loading chamber (112) to a single wafer reactor (118), then to a cooling chamber (120) before returning the wafer to the wafer carrier in the loading chamber (112). The reactor (110) can contain as many as 8 attachable and/or detachable component loading chambers (112), single wafer reactors (118), and cooling chambers (120), in any combination desired, with the stipulation of a maximum of three high temperature single wafer reactors (118). Each component is serviced by the automated wafer handler (114). The loading chambers (112) have doors (not shown) between the ambient area outside the epitaxial equipment and transfer chamber (116), such that when the door to the ambient area is open, the door to the transfer chamber (116) is closed with an airtight seal. Similarly, when the door to the transfer chamber (116) is open, the door to the ambient area is closed with an airtight seal. These seals help prevent contamination in the ambient area from entering the area within the equipment itself.

Figure 4:
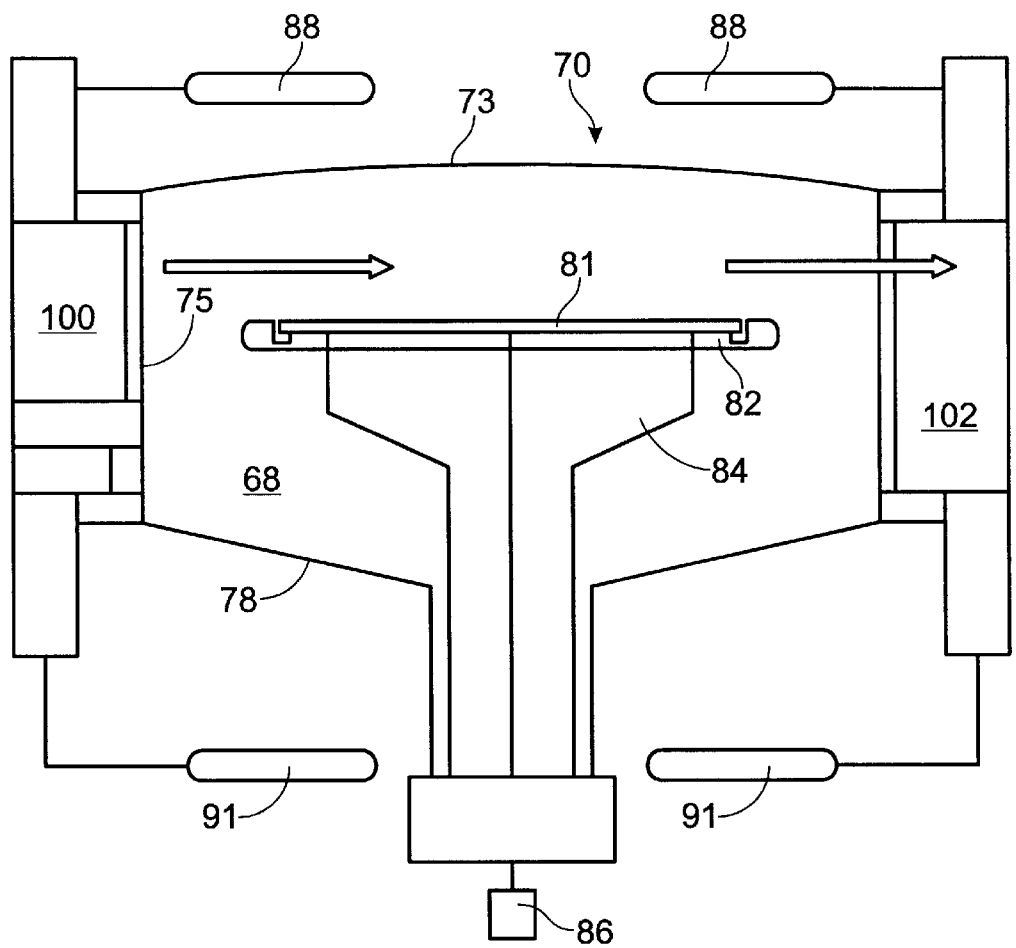
FIG. 4 is a schematic sectional view of a single wafer epitaxial process chamber wherein deposition of an epitaxial layer.occurs in deposition equipment known as a "Centura Reactor".

FIG. 4 reveals the single wafer reactor (70) in which layers of silicon can be deposited onto a wafer (81). The reactor has a top wall (73), side walls (75) and a bottom wall (78) that encloses the reaction chamber (68) into which the wafer (81) can be positioned. The wafer (81) is removably mounted on a susceptor (82) which is then mounted on a pedestal (84) that is rotated by a motor (86) to provide a homogeneously averaged environment for the wafer (81). The wafer (81) is heated by a light source from high intensity lamps (88) and (91). The top wall (73) and the bottom wall (78) are highly transparent to light energy in order to enable the energy from lamps (88) and (91) to enter the reaction chamber (68). An excellent material choice for the top and bottom walls (73) and (78) is quartz because it is transparent to light at visible IR (infrared) and UV (ultra violet) frequencies. It also has a sufficiently high strength to support pressure differences between the outside and the reaction chamber (68), and it has a low rate of outgasing and contamination.

Process gases flow from a gas input port (100) and across the wafer (81) to an exhaust port (102). The gas input port (100) is connected to gas manifolds (not shown) that provides one or a mixture of gases to enter through pipes (not shown) into the input port (100). Gas concentrations, gas flow rates, substrate rotation and temperatures are selected in a way so that processing uniformity is optimized. Rotation of the wafer (81) and thermal gradients from lamps (88) and (91) can have a significant influence of gas flow profiles in the reaction chamber (68). The main flow profile, however, is dominated by the laminar flow from the gas input port (100), across the wafer (81) to the exhaust port (102). Pressures are maintained typically between 1 Torr to 760 Torr, depending on specifications and applications. Since these are elevated pressures as compared to the LPCVD (low pressure chemical vapor deposition) process pressures of less than 1 Torr, such a process is also referred to as high pressure CVD (chemical vapor deposition) or APCVD (atmospheric pressure chemical vapor deposition).

Processing wafers in any of the epitaxial reactors explained above will provide an epitaxial silicon layer on the surface of the wafer, with the orientation of the layer being the same as that of the wafer, and characteristics of the epitaxial layer such as resistivity controlled by the process gases. It is possible to then grow an in-situ protective film layer in the same reaction chamber in which the epitaxial films are grown. As such, subsequent wet processing to provide such a protective film layer can be omitted. Therefore, a preferred embodiment of the invention is an oxidation step immediately after epitaxial deposition to generate a protective film layer with a hydrophilic surface. The thickness of the protective film layer of the present invention is expected to be in the range of 10 Å to 50 Å.

Another preferred embodiment of the proposed invention is an oxidation step to provide a thin oxide layer of about 10 Å to 50 Å during the cool-down phase of the process without requiring added process time. It has been determined that the cool down temperatures and times are sufficient to achieve such a thin film formation. In the case of the Centura reactor, this oxide growth could be facilitated in any area within the equipment.

Another preferred embodiment encompasses a reduction in wet processing. An oxidizing bath after epitaxial deposition would not be required. Any of the thin oxide films formed by the subject process can easily be removed via a hydrofluoric acid (HF) etch, should the user need a bare silicon surface during subsequent semiconductor wafer processing.

In a further embodiment, one or more reaction chambers can be added to the AMT Centura reactor described in FIGS. 4 and 5 to perform any combinations of subsequent processes, including, but not limited to oxidation, nitridation, CVD backside deposition, plasma etching, etc. In such a case, the material would receive epitaxial deposition in one chamber, and be moved to another chamber to receive the protective film, without leaving the confines of the environmentally controlled reactor.

Another embodiment is the possibility of using the thin film formed, such as the thin oxide film as a seed for subsequent treatment (such as oxidation or the like) by wafer users. For example, sandwich structures can be formed such as a nitride film on top of an oxidation as a first device-processing step.

Depending on the epitaxial reactor type, and the individual epitaxial wafer specification, numerous recipes are possible. A common cycle for each of the previously mentioned reactor types presently used is shown in FIGS. 5–7. It should be noted that in all three examples a chemical reagent is introduced into the epitaxial layer process chamber (after formation of an epitaxial layer), and the chemical reagent reacts with the epitaxial layer (which is hydrophobic) in-situ to form an outer layer which is substantially hydrophilic. More specifically, an oxidation or nitridation of the epitaxial layer takes place during the cooling phase of the process without adding time to the process sequence prior to unloading the wafer(s) from the reactor chamber. FIGS. 5–7 represent the processes in scale to each other for the main three different types of equipment used for this type of epitaxial deposition. The Applied Materials batch type barrel reactor is represented by the recipe of FIG. 5, the ASM single wafer reactor by the recipe shown in FIG. 6, and the single/multiple single wafer chamber Applied Materials (Centura) reactor by the recipe depicted in FIG. 7. All three figures show the process cycle with regard to the process temperature, indicated on the ordinate in ° C., and the time t in minutes on the abscissa to which the cycle is associated. It should be understood that all these process steps are generalized.

A typical operation sequence for the conventional barrel type batch reactor process (200), which is illustrated in FIG. 5, is as follows:
  (a) Ramp-up (206) at 0.7° C./s to 1150° C. in an inert $H_2$ atmosphere.
  (b) Bake/etch (209) for about 5 minutes in $H_2$ and HCl at a temperature of 1150° C.
  (c) Ramp-down (212) at 0.5° C./s to a temperature of 1130° C.
  (d) Epitaxial deposition (215) in $H_2$ employing a reactive gas for silicon epitaxial deposition such as Trichlorosilane ($SiHCl_3$) and a dopant such as Phosphine for time period of about 9 minutes.
  (e) Ramp-down (218) at 0.5° C./s in $O_2$ and $H_2$ for forming thin oxidation.
  (f) Unload the finished wafer at about 300° C.

A typical operation sequence for the single-wafer reactor process (300), which is illustrated in FIG. 6, is as follows:
  (a) Ramp-up (306) at 3.2° C./s to a temperature of 1190° C. in an inert $H_2$ atmosphere
  (b) Bake/etch (309) for approximately 2.5 minutes in $H_2$ and HCl at temperature 1190° C.
  (c) Ramp-down (312) at 6° C./s to a temperature 1150° C.
  (d) Epitaxial deposition (315) in $H_2$, employing a reactive gas for silicon epitaxial deposition such as Trichlorosilane ($SiHCl_3$) and a dopant such as Phosphine.
  (e) Ramp-down (317) at 6° C./s in $O_2$ and $H_2$ for forming thin film oxidation.
  (f) Unload the finished wafer at about 900° C.

A typical operation sequence for the Centura reactor process (400), which is illustrated in FIG. 7, is as follows:
  (a) Ramp-up (406) at 18° C./s to a temperature of 1130° C. in an inert $H_2$ atmosphere.
  (b) Bake (409) for approximately 1 min. in $H_2$ at 1130° C.
  (c) Epitaxial deposition (412) in $H_2$, employing a reactive gas for silicon epitaxial deposition such as Trichlorosilane ($SiHCl_3$) and a dopant such as Phosphine for time period from about 15 seconds through 4 minutes, depending on desired layer thickness.
  (d) Ramp-down (415) at 18° C./s in $O_2$ and $H_2$ for forming thin film oxidation.
  (e) Unload the finished wafer at about 700° C.

Some care has to be taken when dealing with an atmosphere consisting of oxygen ($O_2$) and hydrogen ($H_2$) due to the possibility of explosive mixture formation. The limit to form a dangerous mixture of hydrogen and oxygen is reached at about 4.65 volume % of $H_2$ in pure $O_2$ at room temperature or, respectively, a 6.1 volume % of $O_2$ in pure $H_2$ under atmospheric pressure (760 Torr). These ratios will obviously change under different temperature and pressure conditions.

Batch epitaxial reactors typically cool down from the deposition temperature of 1150° C. to about 300° C. to 400° C. (at 760 Torr) before unloading the wafers. Reactors with one or more single wafer reaction chambers typically cool from 1100° C. to about 700° C. to 900° C. (at 760 Torr). Reactors with single or multiple single wafer reaction chambers can afford higher chamber unload temperatures because they typically contain cool down areas or chambers in which the wafers can cool down to temperatures which are tolerated by the wafer carriers, and automated wafer handlers can handle elevated temperatures. These cool down areas are still contained within the controlled environment of the epitaxial equipment, and therefore do not expose the wafer to potential contaminants associated with ambient air.

An inert gas, such as helium or argon could be mixed into the oxygen source to modify dangerous levels of hydrogen-oxygen ratios. The gases would then be fed through mass flow controllers (MFC), mixed with process gases (hydrogen in this case) and fed into the deposit manifold. Additional safety valves and leak detectors coupled with automatic shut-off mechanisms would render additional safety features. Another possible solution is to elect the ideal safe gas ratio by taking the lower explosive mixture and divide it by a safety factor such as 10 to 100.

EXAMPLES

Example 1

A single wafer reactor was utilized to deposit an epitaxial layer on a wafer at a temperature of 1130° C. $SiHCl_3$ was used as the reactive gas with $H_2$ as the carrier gas. When the desired thickness of the epitaxial layer was achieved, the reactive gas supply was terminated, and the reactor was purged with $H_2$ gas at 60 liters per minute prior to cool down for 10 seconds. At the beginning of the cool down cycle, a mixture of between 1000 and 2000 ppm $O_2$ in Argon was introduced at 5 liters per minute while maintaining the 60 liters per minute of $H_2$ gas flow, for 30 seconds. During this 30 second time period, the temperature was reduced to 900° C. and stabilized. Wafers measured demonstrated a hydrophobic oxide layer with a thickness layer of 8 Å, having good oxide thickness uniformity, good haze levels, and good particle levels.

Example 2

A single wafer reactor was utilized to deposit an epitaxial layer on a wafer at a temperature of 1130° C. $SiHCl_3$ was used as the reactive gas with $H_2$ as the carrier gas. When the desired thickness of the epitaxial layer was achieved, the reactive gas supply was terminated, and the reactor was purged with $H_2$ gas at 60 liters per minute prior to cool down for 30 seconds. At the beginning of the cool down cycle, a mixture of between 1000 and 2000 ppm $O_2$ in Argon was introduced at 5 liters per minute while maintaining the 60 liters per minute of $H_2$ gas flow, for 30 seconds. During this 30 second time period, the temperature was reduced to 900° C. and stabilized. Wafers measured demonstrated a hydrophobic oxide layer with a thickness layer of 8 Å, having good oxide thickness uniformity, good haze levels, and good particle levels.

Example 3

A single wafer reactor was utilized to deposit an epitaxial layer on a wafer at a temperature of 1100° C. $SiHCl_3$ was used as the reactive gas with $H_2$ as the carrier gas was employed. When the desired thickness of the epitaxial layer was achieved, the reactive gas supply was terminated, and the reactor was purged with $H_2$ gas at 60 liters per minute prior to cool down for 10 seconds. While maintaining the H2 gas flow, the temperature was cooled to a temperature of 1000° C., wherein this temperature was maintained during the oxidation stage. A gas mixture of between 1000 and 2000 ppm $O_2$ in Argon at 5 liters per minute was introduced into the reactor, with $H_2$ gas flow at 60 liters per minute. The oxide deposition stage was allowed to run for 7 seconds in this constant temperature and gas, after which the $O_2$/Ar mixture was terminated, and the ramp down stage continued. Wafers measured demonstrated a hydrophobic oxide layer with a thickness layer of 10 Å, having good thickness uniformity, good haze levels, and good particle levels.

It is obvious that a skilled artisan could easily adjust various parameters such as time exposed to the $O_2$/Argon gas mixture, the temperature of exposure, or even the concentration of $O_2$ in argon to obtain a desired oxide thickness layer, for example of up to 15 Å, or more.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

That which is claimed is:

1. A method of forming a protective oxide layer on the surface of an epitaxial layer, comprising:

placing a substrate wafer in an epitaxial reactor;

depositing an epitaxial layer on at least one surface of the substrate wafer;

subjecting the substrate wafer containing the epitaxial layer to a gas mixture containing oxygen to grow an oxide layer; and removing the substrate wafer from the epitaxial reactor.

2. The method according to claim 1, wherein the gas mixture containing oxygen contains an amount of oxygen below the lower explosive mixture level.

3. The method according to claim 1, wherein the gas mixture containing oxygen also contains an inert gas.

4. The method according to claim 3, wherein the gas mixture containing oxygen has an oxygen concentration of less than about 2000 parts per million.

5. The method according to claim 3, wherein the inert gas is Argon.

6. The method according to claim 3, wherein the inert gas is helium.

7. The method of claim 1, wherein the protective oxide layer thickness is about 15 angstroms or less.

8. A method of forming a protective oxide layer on the surface of an epitaxial layer, comprising:

placing a substrate wafer in an epitaxial reactor;

depositing an epitaxial layer on at least one surface of the substrate wafer;

subjecting the substrate wafer to hydrogen gas;

subjecting the substrate wafer to a gas mixture containing oxygen to grow an oxide layer; and removing the substrate wafer from the epitaxial reactor.

9. The method according to claim 8, wherein while the substrate wafer is being subjected to the hydrogen gas, the wafer is also subjected to the gas mixture containing oxygen.

10. The method according to claim 9, wherein the substrate wafer is subjected to the gas mixture containing oxygen for less time than the substrate wafer is subjected to the hydrogen gas.

11. The method according to claim 10, wherein the substrate wafer is subjected to the gas mixture containing oxygen for less than one minute.

* * * * *